(12) United States Patent
Wehrly, Jr. et al.

(10) Patent No.: US 7,616,452 B2
(45) Date of Patent: *Nov. 10, 2009

(54) FLEX CIRCUIT CONSTRUCTIONS FOR HIGH CAPACITY CIRCUIT MODULE SYSTEMS AND METHODS

(75) Inventors: James Douglas Wehrly, Jr., Austin, TX (US); Paul Goodwin, Austin, TX (US); Russell Rapport, Austin, TX (US)

(73) Assignee: Entorian Technologies, LP, Austin, TX (US)

( * ) Notice: Subject to any disclaimer, the term of this patent is extended or adjusted under 35 U.S.C. 154(b) by 212 days.

This patent is subject to a terminal disclaimer.

(21) Appl. No.: 11/331,969

(22) Filed: Jan. 13, 2006

(65) Prior Publication Data

US 2006/0125067 A1    Jun. 15, 2006

Related U.S. Application Data

(63) Continuation-in-part of application No. 11/231,418, filed on Sep. 21, 2005, now Pat. No. 7,443,023, and a continuation-in-part of application No. PCT/US2005/028547, filed on Aug. 10, 2005, and a continuation-in- (Continued)

(51) Int. Cl.
    *H05K 1/11* (2006.01)
(52) U.S. Cl. .............. 361/803; 361/736; 361/749; 174/254; 174/260
(58) Field of Classification Search ............ 361/749, 361/684, 687, 690, 728, 737, 803, 707, 736; 29/831, 739; 174/250, 254, 260
See application file for complete search history.

(56) References Cited

U.S. PATENT DOCUMENTS 3,372,310 A    3/1968   Kantor (Continued)

FOREIGN PATENT DOCUMENTS

EP    122-687 (A)    10/1984

(Continued)

OTHER PUBLICATIONS

IDT press release, IDT collaborates on Development of Testing Equipment for Advanced Memory Buffer Devices, Mar. 1, 2005, Online, Archived on www.webarchive.org/web/20050305040525/ http://www.idt.com/?id=177.*

(Continued)

*Primary Examiner*—Dean A. Reichard
*Assistant Examiner*—Xiaoliang Chen
(74) *Attorney, Agent, or Firm*—Fish & Richardson P.C.

(57) ABSTRACT

Provided circuit modules employ flexible circuitry populated with integrated circuitry (ICs). The flex circuitry is disposed about a rigid substrate. Contacts distributed along the flexible circuitry provide connection between the module and an application environment. A strain relief portion of the flex circuitry has preferably fewer layers than the portion of the flex circuitry along which the integrated circuitry is disposed and may further may exhibit more flexibility than the portion of the flex circuit populated with integrated circuitry. The substrate form is preferably devised from thermally conductive materials.

4 Claims, 9 Drawing Sheets

Related U.S. Application Data

(63) part of application No. 11/131,835, filed on May 18, 2005, and a continuation-in-part of application No. 11/068,688, filed on Mar. 1, 2005, now Pat. No. 7,324,352, and a continuation-in-part of application No. 11/007,551, filed on Dec. 8, 2004, now Pat. No. 7,511,968, which is a continuation-in-part of application No. 10/934,027, filed on Sep. 3, 2004, application No. 11/331,969, which is a continuation-in-part of application No. 11/005,992, filed on Dec. 7, 2004, now Pat. No. 7,480,152, which is a continuation-in-part of application No. 10/934,027, filed on Sep. 3, 2004, application No. 11/331,969, which is a continuation-in-part of application No. 11/193,954, filed on Jul. 29, 2005, which is a continuation-in-part of application No. 11/007,551, filed on Dec. 8, 2004, now Pat. No. 7,511,968, application No. 11/331,969, which is a continuation-in-part of application No. 11/123,721, filed on May 6, 2005, and a continuation-in-part of application No. 11/068,688, filed on Mar. 1, 2005, now Pat. No. 7,324,352, which is a continuation-in-part of application No. 11/005,992, filed on Dec. 7, 2004, now Pat. No. 7,480,152, and a continuation-in-part of application No. 10/934,027, filed on Sep. 3, 2004.

(56) References Cited

U.S. PATENT DOCUMENTS

| | | |
|---|---|---|
| 3,436,604 A | 4/1969 | Hyltin |
| 3,582,865 A | 6/1971 | Franck et al. |
| 3,654,394 A | 4/1972 | Gordon |
| 3,704,455 A | 11/1972 | Scarbrough |
| 3,718,842 A | 2/1973 | Abbott, III et al. |
| 3,727,064 A | 4/1973 | Bottini |
| 3,746,934 A | 7/1973 | Stein |
| 3,766,439 A | 10/1973 | Isaacson |
| 3,772,776 A | 11/1973 | Weisenburger |
| 4,169,642 A | 10/1979 | Mouissie |
| 4,288,841 A | 9/1981 | Gogal |
| 4,342,069 A | 7/1982 | Link |
| 4,429,349 A | 1/1984 | Zachry |
| 4,437,235 A | 3/1984 | McIver |
| 4,495,546 A | 1/1985 | Nakamura |
| 4,513,368 A | 4/1985 | Houseman |
| 4,547,834 A | 10/1985 | Dumont et al. |
| 4,567,543 A | 1/1986 | Miniet |
| 4,587,596 A | 5/1986 | Bunnell |
| 4,645,944 A | 2/1987 | Uya |
| 4,656,605 A | 4/1987 | Clayton |
| 4,672,421 A | 6/1987 | Lin |
| 4,682,207 A | 7/1987 | Akasaki et al. |
| 4,696,525 A | 9/1987 | Coller et al. |
| 4,709,300 A | 11/1987 | Landis |
| 4,724,611 A | 2/1988 | Hagihara |
| 4,727,513 A | 2/1988 | Clayton |
| 4,733,461 A | 3/1988 | Nakano |
| 4,739,589 A | 4/1988 | Brehm et al. |
| 4,763,188 A | 8/1988 | Johnson |
| 4,771,366 A | 9/1988 | Blake et al. |
| 4,821,007 A | 4/1989 | Fields et al. |
| 4,823,234 A | 4/1989 | Konishi et al. |
| 4,833,568 A | 5/1989 | Berhold |
| 4,839,717 A | 6/1989 | Phy et al. |
| 4,850,892 A | 7/1989 | Clayton et al. |
| 4,862,249 A | 8/1989 | Carlson |
| 4,911,643 A | 3/1990 | Perry et al. |
| 4,953,060 A | 8/1990 | Lauffer et al. |
| 4,956,694 A | 9/1990 | Eide |
| 4,972,580 A | 11/1990 | Nakamura |
| 4,982,265 A | 1/1991 | Watanabe et al. |
| 4,983,533 A | 1/1991 | Go |
| 4,985,703 A | 1/1991 | Kaneyama |
| 4,992,849 A | 2/1991 | Corbett et al. |
| 4,992,850 A | 2/1991 | Corbett et al. |
| 5,014,115 A | 5/1991 | Moser |
| 5,014,161 A | 5/1991 | Lee et al. |
| 5,016,138 A | 5/1991 | Woodman |
| 5,025,306 A | 6/1991 | Johnson et al. |
| 5,034,350 A | 7/1991 | Marchisi |
| 5,041,015 A | 8/1991 | Travis |
| 5,053,853 A | 10/1991 | Haj-Ali-Ahmadi et al. |
| 5,065,277 A | 11/1991 | Davidson |
| 5,099,393 A | 3/1992 | Bentlage et al. |
| 5,104,820 A | 4/1992 | Go et al. |
| 5,109,318 A | 4/1992 | Funari et al. |
| 5,117,282 A | 5/1992 | Salatino |
| 5,119,269 A | 6/1992 | Nakayama |
| 5,138,430 A | 8/1992 | Gow, 3rd et al. |
| 5,138,434 A | 8/1992 | Wood et al. |
| 5,138,523 A | 8/1992 | Benck et al. |
| 5,140,405 A | 8/1992 | King et al. |
| 5,159,535 A | 10/1992 | Desai et al. |
| 5,173,840 A | 12/1992 | Kodai et al. |
| 5,191,404 A | 3/1993 | Wu et al. |
| 5,208,729 A | 5/1993 | Cipolla et al. |
| 5,214,845 A | 6/1993 | King et al. |
| 5,219,377 A | 6/1993 | Poradish |
| 5,222,014 A | 6/1993 | Lin |
| 5,224,023 A * | 6/1993 | Smith et al. ............... 361/784 |
| 5,229,916 A | 7/1993 | Frankeny et al. |
| 5,229,917 A | 7/1993 | Harris et al. |
| 5,239,198 A | 8/1993 | Lin et al. |
| 5,241,454 A | 8/1993 | Ameen et al. |
| 5,241,456 A | 8/1993 | Marcinkiewiez et al. |
| 5,247,423 A | 9/1993 | Lin et al. |
| 5,252,857 A | 10/1993 | Kane et al. |
| 5,259,770 A | 11/1993 | Bates et al. |
| 5,261,068 A | 11/1993 | Gaskins et al. |
| 5,268,815 A | 12/1993 | Cipolla et al. |
| 5,276,418 A | 1/1994 | Klosowiak et al. |
| 5,281,852 A | 1/1994 | Normington |
| 5,285,398 A | 2/1994 | Janik |
| 5,289,062 A | 2/1994 | Wyland |
| 5,309,986 A | 5/1994 | Itoh |
| 5,313,097 A | 5/1994 | Haj-Ali-Ahmadi et al. |
| 5,343,366 A | 8/1994 | Cipolla et al. |
| 5,347,428 A | 9/1994 | Carson et al. |
| 5,362,656 A | 11/1994 | McMahon |
| 5,375,041 A | 12/1994 | McMahon |
| 5,386,341 A | 1/1995 | Olson et al. |
| 5,394,300 A | 2/1995 | Yoshimura |
| 5,397,916 A | 3/1995 | Normington |
| 5,400,003 A | 3/1995 | Kledzik |
| 5,428,190 A | 6/1995 | Stopperan |
| 5,438,224 A | 8/1995 | Papageorge et al. |
| 5,445,869 A * | 8/1995 | Ishikawa et al. ............ 428/209 |
| 5,448,511 A | 9/1995 | Paurus et al. |
| 5,463,742 A | 10/1995 | Kobayashi |
| 5,471,367 A | 11/1995 | Krumweide et al. |
| 5,477,082 A | 12/1995 | Buckley, III et al. |
| 5,491,612 A | 2/1996 | Nicewarner, Jr. et al. |
| 5,502,333 A | 3/1996 | Bertin et al. |
| 5,513,135 A | 4/1996 | Dell et al. |
| 5,523,619 A | 6/1996 | McAllister et al. |
| 5,523,695 A | 6/1996 | Lin |
| 5,541,812 A | 7/1996 | Burns |
| 5,572,065 A | 11/1996 | Burns |
| 5,600,178 A | 2/1997 | Russell |
| 5,612,570 A | 3/1997 | Eide et al. |
| 5,631,193 A | 5/1997 | Burns |
| 5,642,055 A | 6/1997 | Difrancesco |
| 5,644,161 A | 7/1997 | Burns |

| Patent | Kind | Date | Inventor |
|---|---|---|---|
| 5,646,446 | A | 7/1997 | Nicewarner et al. |
| 5,654,877 | A | 8/1997 | Burns |
| 5,661,339 | A | 8/1997 | Clayton |
| 5,686,730 | A | 11/1997 | Laudon et al. |
| 5,688,606 | A | 11/1997 | Mahulikar et al. |
| 5,708,297 | A | 1/1998 | Clayton |
| 5,714,802 | A | 2/1998 | Cloud et al. |
| 5,717,556 | A | 2/1998 | Yanagida |
| 5,729,894 | A | 3/1998 | Rostoker et al. |
| 5,731,633 | A * | 3/1998 | Clayton ............ 257/723 |
| 5,739,887 | A | 4/1998 | Ueda et al. |
| 5,744,862 | A | 4/1998 | Ishii |
| 5,751,553 | A | 5/1998 | Clayton |
| 5,754,409 | A | 5/1998 | Smith |
| 5,764,497 | A | 6/1998 | Mizumo |
| 5,776,797 | A | 7/1998 | Nicewarner, Jr. et al. |
| 5,777,275 | A | 7/1998 | Mizutani et al. |
| 5,789,815 | A | 8/1998 | Tessier et al. |
| 5,790,447 | A | 8/1998 | Laudon et al. |
| 5,802,395 | A | 9/1998 | Connolly et al. |
| 5,805,422 | A | 9/1998 | Otake et al. |
| 5,818,699 | A | 10/1998 | Fukuoka |
| 5,828,125 | A | 10/1998 | Burns |
| 5,835,988 | A | 11/1998 | Ishii |
| 5,869,353 | A | 2/1999 | Levy et al. |
| 5,899,705 | A | 5/1999 | Akram |
| 5,917,709 | A | 6/1999 | Johnson et al. |
| 5,925,934 | A | 7/1999 | Lim |
| 5,926,369 | A | 7/1999 | Ingraham et al. |
| 5,949,657 | A * | 9/1999 | Karabatsos ............ 361/803 |
| 5,953,214 | A | 9/1999 | Dranchak et al. |
| 5,953,215 | A | 9/1999 | Karabatsos |
| 5,959,839 | A | 9/1999 | Gates |
| 5,963,427 | A | 10/1999 | Bolleson |
| 5,969,945 | A | 10/1999 | Cutting et al. |
| 5,973,395 | A | 10/1999 | Suzuki et al. |
| 5,995,370 | A | 11/1999 | Nakamori |
| 5,999,405 | A | 12/1999 | Zappacosta et al. |
| 6,002,167 | A | 12/1999 | Hatano et al. |
| 6,002,589 | A | 12/1999 | Perino et al. |
| 6,008,538 | A | 12/1999 | Akram et al. |
| 6,014,316 | A | 1/2000 | Eide |
| 6,021,048 | A * | 2/2000 | Smith ............ 361/736 |
| 6,025,992 | A | 2/2000 | Dodge et al. |
| 6,028,352 | A | 2/2000 | Eide |
| 6,028,365 | A | 2/2000 | Akram et al. |
| 6,034,878 | A | 3/2000 | Osaka et al. |
| 6,038,132 | A | 3/2000 | Tokunaga et al. |
| 6,040,624 | A | 3/2000 | Chambers et al. |
| 6,049,975 | A | 4/2000 | Clayton |
| 6,060,339 | A | 5/2000 | Akram et al. |
| 6,061,245 | A | 5/2000 | Ingraham et al. |
| 6,072,233 | A | 6/2000 | Corisis et al. |
| 6,078,515 | A | 6/2000 | Nielsen et al. |
| 6,084,294 | A | 7/2000 | Tomita |
| 6,091,145 | A * | 7/2000 | Clayton ............ 257/724 |
| 6,097,087 | A | 8/2000 | Farnworth et al. |
| 6,111,757 | A | 8/2000 | Dell et al. |
| 6,121,676 | A | 9/2000 | Solberg |
| RE36,916 | E | 10/2000 | Moshayedi |
| 6,157,541 | A | 12/2000 | Hacke |
| 6,172,874 | B1 | 1/2001 | Bartilson |
| 6,178,093 | B1 | 1/2001 | Bhatt et al. |
| 6,180,881 | B1 | 1/2001 | Isaak |
| 6,187,652 | B1 | 2/2001 | Chou et al. |
| 6,205,654 | B1 | 3/2001 | Burns |
| 6,208,521 | B1 | 3/2001 | Nakatsuka |
| 6,208,546 | B1 | 3/2001 | Ikeda |
| 6,214,641 | B1 | 4/2001 | Akram |
| 6,215,181 | B1 | 4/2001 | Akram et al. |
| 6,215,687 | B1 | 4/2001 | Sugano et al. |
| 6,222,737 | B1 | 4/2001 | Ross |
| 6,222,739 | B1 | 4/2001 | Bhakta et al. |
| 6,225,688 | B1 | 5/2001 | Kim et al. |
| 6,232,659 | B1 * | 5/2001 | Clayton ............ 257/724 |
| 6,233,650 | B1 | 5/2001 | Johnson et al. |
| 6,234,820 | B1 | 5/2001 | Perino et al. |
| 6,262,476 | B1 | 7/2001 | Vidal |
| 6,262,895 | B1 | 7/2001 | Forthun |
| 6,265,660 | B1 | 7/2001 | Tandy |
| 6,266,252 | B1 | 7/2001 | Karabatsos |
| 6,281,577 | B1 | 8/2001 | Oppermann et al. |
| 6,288,907 | B1 | 9/2001 | Burns |
| 6,288,924 | B1 | 9/2001 | Sugano et al. |
| 6,300,679 | B1 | 10/2001 | Mukerji et al. |
| 6,307,751 | B1 | 10/2001 | Bodony et al. |
| 6,316,825 | B1 | 11/2001 | Park et al. |
| 6,323,060 | B1 | 11/2001 | Isaak |
| 6,336,262 | B1 | 1/2002 | Dalal et al. |
| 6,343,020 | B1 | 1/2002 | Lin et al. |
| 6,347,394 | B1 | 2/2002 | Ochoa et al. |
| 6,349,050 | B1 | 2/2002 | Woo et al. |
| 6,351,029 | B1 | 2/2002 | Isaak |
| 6,357,023 | B1 | 3/2002 | Co et al. |
| 6,358,772 | B2 | 3/2002 | Miyoshi |
| 6,360,433 | B1 | 3/2002 | Ross |
| 6,368,896 | B2 | 4/2002 | Farnworth et al. |
| 6,370,668 | B1 | 4/2002 | Garrett, Jr. et al. |
| 6,376,769 | B1 | 4/2002 | Chung |
| 6,382,309 | B1 | 5/2002 | Kroliczek et al. |
| 6,392,162 | B1 | 5/2002 | Karabatsos |
| 6,392,305 | B1 * | 5/2002 | Huang et al. ............ 257/782 |
| 6,395,992 | B1 | 5/2002 | Nakayama |
| 6,404,043 | B1 | 6/2002 | Isaak |
| 6,410,857 | B1 | 6/2002 | Gonya |
| 6,426,240 | B2 | 7/2002 | Isaak |
| 6,426,549 | B1 | 7/2002 | Isaak |
| 6,426,560 | B1 | 7/2002 | Kawamura et al. |
| 6,428,360 | B2 | 8/2002 | Hassanzadeh et al. |
| 6,433,418 | B1 | 8/2002 | Fujisawa et al. |
| 6,444,921 | B1 | 9/2002 | Wang et al. |
| 6,446,158 | B1 | 9/2002 | Karabatsos |
| 6,449,159 | B1 | 9/2002 | Haba |
| 6,452,826 | B1 | 9/2002 | Kim et al. |
| 6,459,152 | B1 | 10/2002 | Tomita et al. |
| 6,462,412 | B2 | 10/2002 | Kamei et al. |
| 6,465,877 | B1 | 10/2002 | Farnworth et al. |
| 6,465,893 | B1 | 10/2002 | Khandros et al. |
| 6,472,735 | B2 | 10/2002 | Isaak |
| 6,473,308 | B2 | 10/2002 | Forthun |
| 6,486,544 | B1 | 11/2002 | Hashimoto |
| 6,489,687 | B1 | 12/2002 | Hashimoto |
| 6,502,161 | B1 | 12/2002 | Perego et al. |
| 6,514,793 | B2 | 2/2003 | Isaak |
| 6,521,984 | B2 | 2/2003 | Matsuura |
| 6,528,870 | B2 | 3/2003 | Fukatsu et al. |
| 6,531,772 | B2 | 3/2003 | Akram et al. |
| 6,544,815 | B2 | 4/2003 | Isaak |
| 6,552,910 | B1 | 4/2003 | Moon et al. |
| 6,552,948 | B2 | 4/2003 | Woo et al. |
| 6,560,117 | B2 | 5/2003 | Moon |
| 6,566,746 | B2 | 5/2003 | Isaak et al. |
| 6,572,387 | B2 | 6/2003 | Burns et al. |
| 6,573,593 | B1 | 6/2003 | Syri et al. |
| 6,576,992 | B1 | 6/2003 | Cady et al. |
| 6,588,095 | B2 | 7/2003 | Pan |
| 6,590,282 | B1 | 7/2003 | Wang et al. |
| 6,590,781 | B2 | 7/2003 | Kollipara et al. |
| 6,600,222 | B1 | 7/2003 | Levardo |
| 6,614,664 | B2 | 9/2003 | Lee |
| 6,627,984 | B2 | 9/2003 | Bruce et al. |
| 6,629,855 | B1 | 10/2003 | North et al. |
| 6,646,936 | B2 | 11/2003 | Hamamatsu et al. |
| 6,660,561 | B2 | 12/2003 | Forthun |
| 6,661,092 | B2 | 12/2003 | Shibata et al. |
| 6,677,670 | B2 | 1/2004 | Kondo |

| | | |
|---|---|---|
| 6,683,377 B1 | 1/2004 | Shim et al. |
| 6,690,584 B2 | 2/2004 | Uzuka et al. |
| 6,699,730 B2 | 3/2004 | Kim et al. |
| 6,720,652 B2 | 4/2004 | Akram et al. |
| 6,721,181 B1 | 4/2004 | Pfeifer et al. |
| 6,721,185 B2 | 4/2004 | Dong et al. |
| 6,721,226 B2 | 4/2004 | Woo et al. |
| 6,744,656 B2 | 6/2004 | Sugano et al. |
| 6,751,113 B2 | 6/2004 | Bhakta et al. |
| 6,756,661 B2 | 6/2004 | Tsuneda et al. |
| 6,760,220 B2 | 7/2004 | Canter et al. |
| 6,762,942 B1 * | 7/2004 | Smith .................. 361/749 |
| 6,768,660 B2 | 7/2004 | Kong et al. |
| 6,775,139 B2 | 8/2004 | Hsueh |
| 6,833,981 B2 | 12/2004 | Suwabe et al. |
| 6,833,984 B1 | 12/2004 | Belgacem |
| 6,839,266 B1 | 1/2005 | Garrett, Jr. et al. |
| 6,841,868 B2 | 1/2005 | Akram et al. |
| 6,850,414 B2 | 2/2005 | Benisek et al. |
| 6,873,534 B2 | 3/2005 | Bhakta et al. |
| 6,878,571 B2 | 4/2005 | Isaak et al. |
| 6,884,653 B2 | 4/2005 | Larson |
| 6,888,719 B1 | 5/2005 | Janzen et al. |
| 6,914,324 B2 | 7/2005 | Rapport et al. |
| 6,919,626 B2 | 7/2005 | Burns |
| 6,956,284 B2 | 10/2005 | Cady et al. |
| 6,975,034 B2 | 12/2005 | Hennig et al. |
| 7,053,478 B2 | 5/2006 | Roper et al. |
| 7,094,632 B2 | 8/2006 | Cady et al. |
| 7,106,595 B2 | 9/2006 | Foster et al. |
| 7,154,751 B2 | 12/2006 | Furuyama et al. |
| 7,157,646 B2 | 1/2007 | Lauffer et al. |
| 7,180,167 B2 | 2/2007 | Partridge et al. |
| 7,187,552 B1 | 3/2007 | Stewart et al. |
| 7,235,871 B2 | 6/2007 | Corsis |
| 7,254,036 B2 | 8/2007 | Pauley et al. |
| 7,289,327 B2 | 10/2007 | Goodwin et al. |
| 7,393,226 B2 | 7/2008 | Clayton et al. |
| 7,394,149 B2 | 7/2008 | Clayton et al. |
| 7,443,023 B2 | 10/2008 | Wehrly et al. |
| 7,446,410 B2 * | 11/2008 | Wehrly et al. ............ 257/707 |
| 7,459,784 B2 | 12/2008 | Wehrly et al. |
| 7,480,152 B2 * | 1/2009 | Goodwin ............... 361/803 |
| 2001/0001085 A1 | 5/2001 | Hassanzadeh et al. |
| 2001/0006252 A1 | 7/2001 | Kim et al. |
| 2001/0013423 A1 | 8/2001 | Dalal et al. |
| 2001/0015487 A1 | 8/2001 | Forthun |
| 2001/0026009 A1 | 10/2001 | Tsuneda et al. |
| 2001/0028588 A1 | 10/2001 | Yamada et al. |
| 2001/0035572 A1 | 11/2001 | Isaak |
| 2001/0040793 A1 | 11/2001 | Inaba |
| 2001/0052637 A1 | 12/2001 | Akram et al. |
| 2002/0001216 A1 | 1/2002 | Sugano et al. |
| 2002/0006032 A1 | 1/2002 | Karabatsos |
| 2002/0030995 A1 | 3/2002 | Shoji |
| 2002/0034068 A1 | 3/2002 | Weber et al. |
| 2002/0038405 A1 * | 3/2002 | Leddige et al. ........... 711/115 |
| 2002/0076919 A1 | 6/2002 | Peters et al. |
| 2002/0076959 A1 | 6/2002 | Lee |
| 2002/0094603 A1 | 7/2002 | Isaak |
| 2002/0101261 A1 | 8/2002 | Karabatsos |
| 2002/0125039 A1 * | 9/2002 | Marketkar et al. ......... 174/250 |
| 2002/0138159 A1 | 9/2002 | Atkinson |
| 2002/0139577 A1 | 10/2002 | Miller |
| 2002/0164838 A1 | 11/2002 | Moon et al. |
| 2002/0180022 A1 | 12/2002 | Emoto |
| 2002/0185731 A1 | 12/2002 | Akram et al. |
| 2002/0196612 A1 | 12/2002 | Gall et al. |
| 2003/0002262 A1 | 1/2003 | Benisek et al. |
| 2003/0016710 A1 | 1/2003 | Komoto |
| 2003/0026155 A1 | 2/2003 | Yamagata |
| 2003/0035328 A1 | 2/2003 | Hamamatsu et al. |
| 2003/0045025 A1 | 3/2003 | Coyle et al. |
| 2003/0049886 A1 | 3/2003 | Salmon |
| 2003/0064548 A1 | 4/2003 | Isaak |
| 2003/0081387 A1 | 5/2003 | Schulz |
| 2003/0081392 A1 | 5/2003 | Cady et al. |
| 2003/0089978 A1 | 5/2003 | Miyamoto et al. |
| 2003/0090879 A1 | 5/2003 | Doblar et al. |
| 2003/0096497 A1 | 5/2003 | Moore et al. |
| 2003/0107118 A1 | 6/2003 | Pflughaupt et al. |
| 2003/0109078 A1 | 6/2003 | Takahashi et al. |
| 2003/0116835 A1 * | 6/2003 | Miyamoto et al. .......... 257/678 |
| 2003/0159278 A1 | 8/2003 | Peddle |
| 2003/0168725 A1 | 9/2003 | Warner et al. |
| 2003/0234443 A1 * | 12/2003 | Partridge et al. ........... 257/686 |
| 2004/0000708 A1 | 1/2004 | Rapport et al. |
| 2004/0012991 A1 | 1/2004 | Kozaru |
| 2004/0021211 A1 | 2/2004 | Damberg |
| 2004/0099938 A1 | 5/2004 | Kang et al. |
| 2004/0105292 A1 | 6/2004 | Matsui |
| 2004/0150107 A1 | 8/2004 | Cha et al. |
| 2004/0229402 A1 | 11/2004 | Cady et al. |
| 2004/0236877 A1 * | 11/2004 | Burton ................... 710/22 |
| 2004/0256731 A1 | 12/2004 | Mao et al. |
| 2004/0262737 A1 | 12/2004 | Haba |
| 2005/0018412 A1 | 1/2005 | Roper et al. |
| 2005/0047776 A1 | 3/2005 | Watanabe et al. |
| 2005/0057911 A1 | 3/2005 | Rapport et al. |
| 2005/0082663 A1 | 4/2005 | Wakiyama et al. |
| 2005/0105350 A1 * | 5/2005 | Zimmerman ............... 365/201 |
| 2005/0108468 A1 | 5/2005 | Hazelzet et al. |
| 2005/0133897 A1 | 6/2005 | Baek et al. |
| 2005/0138267 A1 * | 6/2005 | Bains et al. .............. 711/100 |
| 2005/0146031 A1 | 7/2005 | Partridge et al. |
| 2005/0217895 A1 | 10/2005 | Maharshak et al. |
| 2005/0242423 A1 | 11/2005 | Partridge et al. |
| 2005/0251586 A1 | 11/2005 | Lin |
| 2005/0263911 A1 | 12/2005 | Igarashi et al. |
| 2006/0020740 A1 | 1/2006 | Bartley et al. |
| 2006/0036827 A1 | 2/2006 | Dell et al. |
| 2006/0043581 A1 | 3/2006 | Prokofiev |
| 2006/0048385 A1 | 3/2006 | Cady et al. |
| 2006/0049500 A1 | 3/2006 | Goodwin |
| 2006/0049502 A1 | 3/2006 | Goodwin et al. |
| 2006/0049512 A1 | 3/2006 | Goodwin et al. |
| 2006/0049513 A1 | 3/2006 | Goodwin |
| 2006/0050488 A1 | 3/2006 | Goodwin |
| 2006/0050489 A1 | 3/2006 | Wehrly et al. |
| 2006/0050492 A1 | 3/2006 | Goodwin et al. |
| 2006/0050496 A1 | 3/2006 | Goodwin |
| 2006/0050497 A1 | 3/2006 | Goodwin |
| 2006/0050498 A1 | 3/2006 | Cady et al. |
| 2006/0053345 A1 | 3/2006 | Goodwin |
| 2006/0083043 A1 | 4/2006 | Cypher |
| 2006/0090102 A1 | 4/2006 | Wehrly et al. |
| 2006/0091529 A1 | 5/2006 | Wehrly et al. |
| 2006/0095592 A1 | 5/2006 | Borkenhagen |
| 2006/0111866 A1 | 5/2006 | LeClerg et al. |
| 2006/0125067 A1 | 6/2006 | Wehrly et al. |
| 2006/0129888 A1 | 6/2006 | Szewerenko et al. |
| 2006/0198238 A1 | 9/2006 | Partridge et al. |
| 2006/0203442 A1 | 9/2006 | Goodwin |
| 2006/0250780 A1 | 11/2006 | Goodwin et al. |
| 2006/0261449 A1 | 11/2006 | Rapport et al. |
| 2007/0111606 A1 | 5/2007 | Goodwin |
| 2007/0115017 A1 | 5/2007 | Goodwin et al. |
| 2007/0126124 A1 | 6/2007 | Rapport et al. |
| 2007/0126125 A1 | 6/2007 | Rapport et al. |
| 2007/0176286 A1 | 8/2007 | Wehrly |
| 2007/0201208 A1 | 8/2007 | Goodwin et al. |
| 2007/0211426 A1 | 9/2007 | Clayton et al. |
| 2007/0211711 A1 | 9/2007 | Clayton |
| 2007/0212906 A1 | 9/2007 | Clayton et al. |
| 2007/0212920 A1 | 9/2007 | Clayton et al. |
| 2007/0258217 A1 | 11/2007 | Roper et al. |

| | | |
|---|---|---|
| 2007/0263359 A1 | 11/2007 | Lai et al. |
| 2007/0290313 A1 | 12/2007 | Partridge |
| 2008/0013282 A1 | 1/2008 | Hoss et al. |
| 2008/0030966 A1 | 2/2008 | Goodwin |
| 2008/0030972 A1 | 2/2008 | Goodwin |
| 2008/0192428 A1 | 8/2008 | Clayton et al. |

FOREIGN PATENT DOCUMENTS

| | | |
|---|---|---|
| EP | 0 298 211 A3 | 1/1989 |
| EP | 0527044 | 6/1996 |
| EP | 1 119049 A2 | 7/2001 |
| GB | 2 130 025 A | 5/1984 |
| JP | 53-85159 | 7/1978 |
| JP | 58-96756 (A) | 6/1983 |
| JP | 63-114195 | 3/1990 |
| JP | 3-102862 | 4/1991 |
| JP | 5-29534 (A) | 2/1993 |
| JP | 5-335695 (A) | 12/1993 |
| JP | 2821315 (B2) | 11/1998 |
| JP | 11003955 A | 1/1999 |
| JP | 2000/031614 | 1/2000 |
| JP | 2001/077294 (A) | 3/2001 |
| JP | 2001/085592 (A) | 3/2001 |
| JP | 2001/168268 | 6/2001 |
| JP | 2001/332683 (A) | 11/2001 |
| JP | 2002/009231 (A) | 1/2002 |
| JP | 2002/359448 | 12/2002 |
| JP | 04-234157 | 1/2003 |
| JP | 2003/031757 | 1/2003 |
| JP | 2003/037246 (A) | 2/2003 |
| JP | 2003/086750 (A) | 3/2003 |
| JP | 2003/086761 (A) | 3/2003 |
| JP | 2003/309246 (A) | 10/2003 |
| JP | 2003/347503 (A) | 12/2003 |
| WO | WO03/037053 | 5/2003 |
| WO | WO 03/037053 A1 | 5/2003 |
| WO | WO 2004/109802 A1 | 12/2004 |

OTHER PUBLICATIONS

U.S. Appl. No. 11/306,803, filed Jan. 11, 2006, Chris Karabatsos.
Complaint filed Mar. 8, 2007, in the United States District Court for the District of Massachusetts, Boston Division, Civil Action No. 07 CA 10468 DPW.
Letter dated Sep. 11, 2006, from Chris Karabatsos of Kentron Technologies to John Kelly, President of JEDEC Solid State Technology Association, concerning potential interferences involving U.S. Appl. No. 11/306,803.
PCT/US05/28547 International Search Report and Written Opinion, PCT, Aug. 18, 2006.
PCT/US05/28547 Notification Concerning Transmittal of Copy of International Preliminary Report on Patentability, Mar. 15, 2007.
GB 0516622.8 Search Report May 25, 2006.
PCT/US06/04690 International Search Report. PCT, Feb. 16, 2007.
PCT/US06/38720 International Search Report and Written Opinion, PCT, Apr. 5, 2007.
U.S. Appl. No. 10/934,027, filed Sep. 3, 2004.
U.S. Appl. No. 11/005,992, filed Dec. 7, 2004.
U.S. Appl. No. 11/007,551, filed Dec. 8, 2004.
U.S. Appl. No. 11/058,979, filed Feb. 16, 2005.
U.S. Appl. No. 11/068,688, filed Mar. 1, 2005.
U.S. Appl. No. 11/077,952, filed Mar. 11, 2005.
U.S. Appl. No. 11/123,721, filed May 6, 2005.
U.S. Appl. No. 11/124,506, filed May 6, 2005.
U.S. Appl. No. 11/125,018, filed May 9, 2005.
U.S. Appl. No. 11/131,835, filed May 18, 2005.
U.S. Appl. No. 11/157,565, filed Jun. 21, 2005.
U.S. Appl. No. 11/173,450, filed Jul. 1, 2005.
U.S. Appl. No. 11/187,269, filed Jul. 22, 2005.
U.S. Appl. No. 11/193,954, filed Jul. 29, 2005.
U.S. Appl. No. 11/231,418, filed Sep. 21, 2005.
U.S. Appl. No. 11/242,962, filed Oct. 4, 2005.
U.S. Appl. No. 11/255,061, filed Oct. 19, 2005.
U.S. Appl. No. 11/283,355, filed Nov. 18, 2005.
U.S. Appl. No. 11/332,740, filed Jan. 13, 2006.
U.S. Appl. No. 11/364,489, filed Feb. 27, 2006.
U.S. Appl. No. 11/397,597, filed Apr. 3, 2006.
U.S. Appl. No. 11/517,198, filed Sep. 7, 2006.
U.S. Appl. No. 11/564,199, filed Nov. 28, 2006.
U.S. Appl. No. 11/624,608, filed Jan. 18, 2007.
U.S. Appl. No. 11/668,416, filed Jan. 29, 2007.
U.S. Appl. No. 11/668,425, filed Jan. 29, 2007.
Pages 19-22 of Presentation by Netlist, Aug. 2004.
Flexible Printed Circuit Technology—A Versatile Interconnection Option. (Website 2 pages) Fjelstad, Joseph. Dec. 3, 2002.
Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002. Published on Internet.
Tessera uZ Ball Stack Package. 4 figures that purport to be directed to the uZ—Ball Stacked Memory, Published on the Internet.
Chip Scale Review Online—An Independent Journal Dedicated to the Advancement of Chip-Scale Electronics. (Website 9 pages) Fjelstad, Joseph, Pacific Consultants L.L.C., Published Jan. 2001 on Internet.
Flexible Thinking: Examining the Flexible Circuit Tapes. (Website 2 pages) Fjelstad, Joseph., Published Apr. 20, 2000 on Internet.
Ron Bauer, Intel. "Stacked-CSP Delivers Flexibility, Reliability, and Space-Saving Capabilities", vol. 3, Spring 2002. Published on the Internet.
Tessera Technologies, Inc.—Semiconductor Intellectual Property, Chip Scale Packaging—Website pages (3), Internet.
Tessera Introduces uZ ä—Ball Stacked Memory Package for Computing and Portable Electronic Products Joyce Smaragdis, Tessera Public Relations, Sandy Skees, MCA PR (www.tessera.com/news_events/press_coverage.cfm); 2 figures that purport to be directed to the uZ ä—Ball Stacked Memory Package, Published Jul. 17, 2002 in San Jose, CA.
William R. Newberry, Design Techniques for Ball Grid Arrays, Xynetix Design Systems, Inc., Portland, Maine, Published on the Internet.
Chip Scale Packaging and Redistribution, Paul A. Magill, Glenn A. Rinne, J. Daniel Mis, Wayne C. Machon, Joseph W. Baggs, Unitive Electronics, Inc.
Dense-Pac Microsystems, 16 Megabit High CMOS SRAM DPS1MX16MKn3.
Dense-Pac Microsystems, 258 Megabyte CMOS DRAM DP3ED32MS72RW5.
Dense-Pac Microsystems, Breaking Space Barriers, 3-D Technology 1993.
Dense-Pac Microsystems, DPS512X16A3, Ceramic 512k X 16 CMOS SRAM Module.
IBM Preliminary 168 Pin SDRAM Registered DIMM Functional Description & Timing Diagrams.
3D Interconnection for Ultra-Dense Multichip Modules, Christian VAL, Thomson-CSF DCS Computer Division, Thierry Lemoine, Thomson-CSF RCM Radar Countermeasures Division.
High Density Memory Packaging Technology High Speed Imaging Applications, Dean Frew, Texas Instruments Incorporated.
Vertically-Intergrated Package, Alvin Weinberg, Pacesetter, Inc. and W. Kinzy Jones, Florida International University.
GB 0516622.8 Search Report, Dec. 31, 2005.
GB 0822086.5 Search Report, Jan. 14, 2009.
JP 2005-235451 Search Report, Nov. 18, 2008.
PCT/US06/04690 International Search Report, PCT, Jul. 20, 2007.
PCT/US06/06921 International Search Report and Written Opinion, PCT, Jun. 1, 2007.
PCT/US2006/007193, International Search Report and Written Opinion of the International Searching Authority, PCT, Nov. 7, 2007.

* cited by examiner

FLEX CIRCUIT CONSTRUCTIONS FOR HIGH CAPACITY CIRCUIT MODULE SYSTEMS AND METHODS

RELATED APPLICATIONS

This application is a continuation-in-part of Pat. App. No. PCT/US2005/028547 filed Aug. 10, 2005; a continuation-in-part of U.S. patent application Ser. No. 11/231,418, filed Sep. 21, 2005 now U.S. Pat. No. 7,443,023, and a continuation-in-part of U.S. patent application Ser. No. 11/068,688, filed Mar. 1, 2005 now U.S. Pat. No. 7,324,352. This application is also a continuation-in-part of U.S. patent application Ser. No. 11/131,835, filed May 18, 2005. This application is also a continuation-in-part of U.S. patent application Ser. No. 11/007,551 filed Dec. 8, 2004 now U.S. Pat. No. 7,511,968, which application is a continuation-in-part of U.S. patent application Ser. No. 10/934,027 filed Sep. 3, 2004, pending. This application is also a continuation-in-part of U.S. patent application Ser. No. 11/005,992 filed Dec. 7, 2004 now U.S. Pat. No. 7,480,152, which application is a continuation-in-part of U.S. patent application Ser. No. 10/934,027 filed Sep. 3, 2004. This application is also a continuation-in-part of U.S. patent application Ser. No. 11/193,954 filed Jul. 29, 2005, pending, which application is a continuation-in-part of U.S. patent application Ser. No. 11/007,551 filed Dec. 8, 2004 now U.S. Pat. No. 7,511,968. This application is also a continuation-in-part of U.S. patent application Ser. No. 10/934,027 filed Sep. 3, 2004, pending. This application is also a continuation-in-part of U.S. patent application Ser. No. 11/123,721 filed May 6, 2005, pending, which application is a continuation-in-part of both U.S. patent application Ser. No. 11/068,688 filed Mar. 1, 2005 now U.S. Pat. No. 7,324,352 and U.S. patent application Ser. No. 11/005,992 filed Dec. 7, 2004 now U.S. Pat. No. 7,480,152.

Pat. App. No. PCT/US05/28547; U.S. patent application Ser. No. 11/231,418; U.S. patent application Ser. No. 10/934,027; U.S. patent application Ser. No. 11/068,688; U.S. patent application Ser. No. 11/005,992; U.S. patent application Ser. No. 11/193,954; U.S. patent application Ser. No. 11/123,721; U.S. patent application Ser. No. 11/131,835; and U.S. patent application Ser. No. 11/007,551 are each hereby incorporated by reference herein.

FIELD

The present invention relates to systems and methods for creating high density circuit modules and, in particular, to systems and methods for flex circuit construction for employment in high density circuit modules.

BACKGROUND

Memory expansion is one of the many fields where high density circuit module solutions provide space-saving advantages. For example, the well-known DIMM (Dual In-line Memory Module) has been used for years, in various forms, to provide memory expansion. A typical DIMM includes a conventional PCB (printed circuit board) with memory devices and supporting digital logic devices mounted on both sides. The DIMM is typically mounted in the host computer system by inserting a contact-bearing edge of the DIMM into a card edge connector. Typically, systems that employ DIMMs provide limited profile space for such devices and conventional DIMM-based solutions have typically provided only a moderate amount of memory expansion.

As bus speeds have increased, fewer devices per channel can be reliably addressed with a DIMM-based solution. For example, 288 ICs or devices per channel may be addressed using the SDRAM-100 bus protocol with an unbuffered DIMM. Using the DDR-200 bus protocol, approximately 144 devices may be addressed per channel. With the DDR2-400 bus protocol, only 72 devices per channel may be addressed. This constraint has led to the development of the fully-buffered DIMM (FB-DIMM) with buffered C/A and data in which 288 devices per channel may be addressed. That buffering function is provided by what is typically identified as the Advanced Memory Buffer or AMB. With the FB-DIMM, not only has capacity increased, pin count has declined to approximately 69 signal pins from the approximately 240 pins previously required.

There are several known methods to improve the limited capacity of a DIMM or other circuit board. In one strategy, for example, small circuit boards (daughter cards) are connected to the DIMM to provide extra mounting space. The additional connection may, however, cause flawed signal integrity for the data signals passing from the DIMM to the daughter card while the additional thickness of the daughter card(s) increases the profile of the module.

Multiple die packages (MDP) can also be used to increase DIMM capacity. This scheme increases the capacity of the memory devices on the DIMM by including multiple semiconductor die in a single device package. The additional heat generated by the multiple die typically requires, however, additional cooling capabilities to operate at maximum operating speed. Further, the MDP scheme may exhibit increased costs because of increased yield loss from packaging together multiple die that are not fully pre-tested.

Stacked packages are yet another way to increase module capacity. Capacity is increased by stacking packaged integrated circuits to create a high-density circuit module for mounting on the larger circuit board. In some techniques, flexible conductors are used to selectively interconnect packaged integrated circuits. Staktek Group L.P. has developed numerous systems for aggregating CSP (chipscale packaged) devices in space saving topologies. The increased component height of some stacking techniques may, however, alter system requirements such as, for example, required cooling airflow or the minimum spacing around a circuit board on its host system.

The present assignee, Staktek Group L.P., has also developed a number of new technologies for circuit modules that can supplant traditional DIMMs. Examples of these new circuit module constructions are shown in the several patent applications incorporated by reference herein. These new technologies populate flex circuitry with integrated circuits and, in preferred embodiments, dispose the IC-populated flex circuitry about a rigid substrate. Edge connector contacts are disposed along the flex circuitry to provide a connective facility for the module which, through these new constructions, provides increased capacity as well as, typically, thermal advantages. With the added IC capacity however, there typically comes a high internal density requirement for the flex circuit that may be implemented with multiple layer flex circuitry. In preferred modes, however, the flex circuitry transits through at least one bend about the end of the rigid substrate and typically passes through at least another arcuate path around a flex support that is typically part of the rigid substrate as shown in a variety of the patent applications incorporated by reference herein. These passages through one or more bends can, in some cases, be problematic where flex circuitry is employed to implement the variety of connections implicated by a complex high capacity circuit module devised to supplant a contemporary DIMM. Consequently, what is needed is a construction and technique to ameliorate difficulties in low profile, high capacity flex circuit based circuit modules.

SUMMARY

Provided circuit modules employ flexible circuitry populated with integrated circuitry (ICs). The flex circuitry is disposed about a rigid substrate. Contacts distributed along the flexible circuitry provide connection between the module and an application environment. A strain relief portion of the flex circuitry has preferably fewer layers than the portion of the flex circuitry along which the integrated circuitry is disposed and may further may exhibit more flexibility than the portion of the flex circuit populated with integrated circuitry. The substrate form is preferably devised from thermally conductive materials.

DETAILED DESCRIPTION OF PREFERRED EMBODIMENTS

Figure 1:
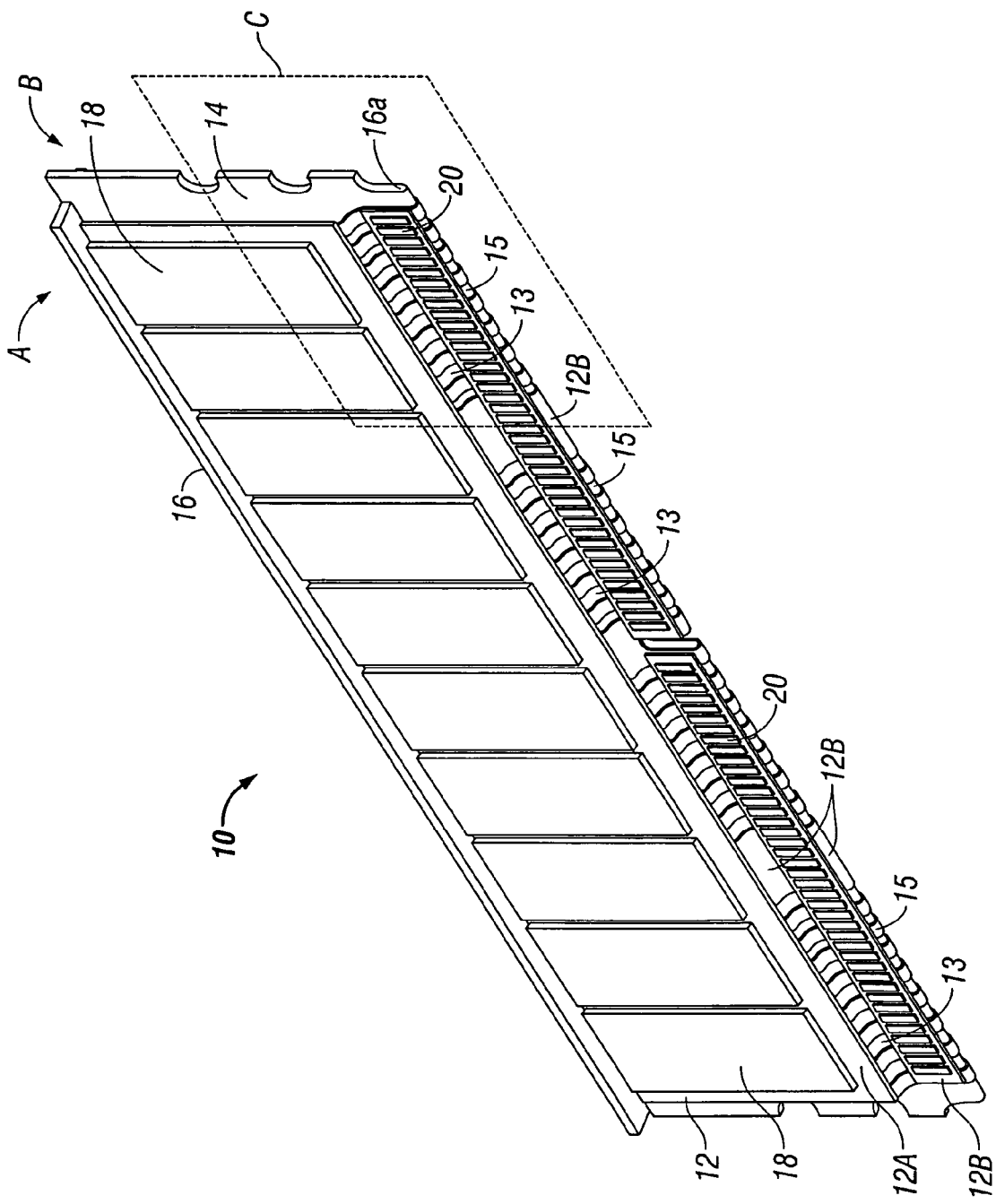
FIG. 1 is a perspective view of a circuit module in accordance with a preferred embodiment of the present invention.

FIG. 1 is a perspective view of a circuit module 10 devised in accordance with a preferred embodiment of the present invention. As depicted in FIG. 1, module 10 has two sides A and B and includes rigid substrate 14 having two opposing lateral sides 14A and 14B (shown in more detail in cross-section in FIG. 7) about which flex circuitry 12 is disposed. Substrate 14 is preferably comprised of thermally conductive material such as a metallic material with aluminum being a preferred choice for its thermal conductivity and ease of fabrication and cost while other thermally conductive materials may also be preferred such as thermally conductive plastics or carbon based materials. As shown, substrate 14 includes optional extension 16.

Flex circuitry 12 has two portions 12A and a portion 12B. Portions 12A of flex circuit 12 are populated with ICs 18 along at least one of the two major surfaces of flex circuit 12 as shown in more detail in later Figs. Portion 12B transits about end 16A of substrate 14. In a preferred embodiment, portions 12A will be rigid while portion 12B will be flexible and thus, flex circuit 12 may preferentially be devised from what is sometimes identified as "rigid-flex" with the flexible part corresponding to portion 12B and the rigid part corresponding to portions 12B of flex circuit 12. Those of skill will recognize that rigid-flex is not required for the invention and a variety of flex circuitry constructions may be employed in preferred embodiments according to the principles disclosed herein.

A part of the side of flex circuit 12 visible in part in FIG. 1 is later shown in FIG. 3 before disposition of flex circuit 12 about substrate 14. In a preferred embodiment, ICs 18 are memory devices in CSP packages. For purposes of this disclosure, the term chip-scale or "CSP" shall refer to integrated circuitry of any function with an array package providing connection to one or more die through contacts (often embodied as "bumps" or "balls" for example) distributed across a major surface of the package or die. CSP does not refer to leaded devices that provide connection to an integrated circuit within the package through leads emergent from at least one side of the periphery of the package such as, for example, a TSOP. Embodiments of the present invention may be employed with leaded or CSP devices or other devices in both packaged and unpackaged forms but where the term CSP is used, the above definition for CSP should be adopted. Consequently, although CSP excludes leaded devices, references to CSP are to be broadly construed to include the large variety of array devices (and not to be limited to memory only) and whether die-sized or other size such as BGA and micro BGA as well as flip-chip. As those of skill will understand after appreciating this disclosure, some embodiments of the present invention may be devised to employ stacks of ICs each disposed where an IC 18 is indicated in the exemplar Figs.

Multiple integrated circuit die may be included in a package depicted as a single IC 18. While in this embodiment memory ICs are used to provide a memory expansion board or module, and various embodiments may include a variety of integrated circuits and other components. Such variety may include microprocessors, FPGA's, RF transceiver circuitry, digital logic, as a list of non-limiting examples, or other circuits or systems which may benefit from a high-density circuit board or module capability.

As will be illustrated in later Figs., other ICs in addition to or other than ICs 18 may be employed with module 10 such as, for example, an IC 19 which may be, for example, an advanced memory buffer (AMB) as employed in a fully-buffered DIMM instantiation on module 10.

With continuing reference to FIG. 1, as shown, flex circuitry 12 exhibits 12A parts or portions and a 12B part or portion. In the depicted embodiment, portions 12A of flex circuit 12 are populated with ICs 18 of module 10 while portion 12B of flex circuitry 12 corresponds to a portion of flex circuit 12 that includes selected areas where flex circuitry 12 takes an arcuate path about substrate 14, such as, for example, along substrate edge or end 16A and about later shown flex support 14FS. Thus, portions 12A of flex circuit 12 may be alternatively identified as IC-mounting portions while portion 12B of flex circuit 12 may be identified as a substrate transit portion of flex circuit 12.

Contacts 20 provide a connective facility for module 10 to an application environment and are depicted as being edge connector contacts so that module 10 may supplant a traditional DIMM comprised from, for example, FR4 board populated with ICs. In portion 12B, flex circuit 12 preferably exhibits strain penetrations 13 and 15 with strain penetrations 15 being disposed proximal to the area about end 16A of substrate 14. As will be later shown in more detail, in the present embodiment, portion 12B of flex circuit 12 exhibits fewer layers than portions 12A thus providing an enhanced ability for flex circuit 12 to transit about substrate 14.

Figure 2:
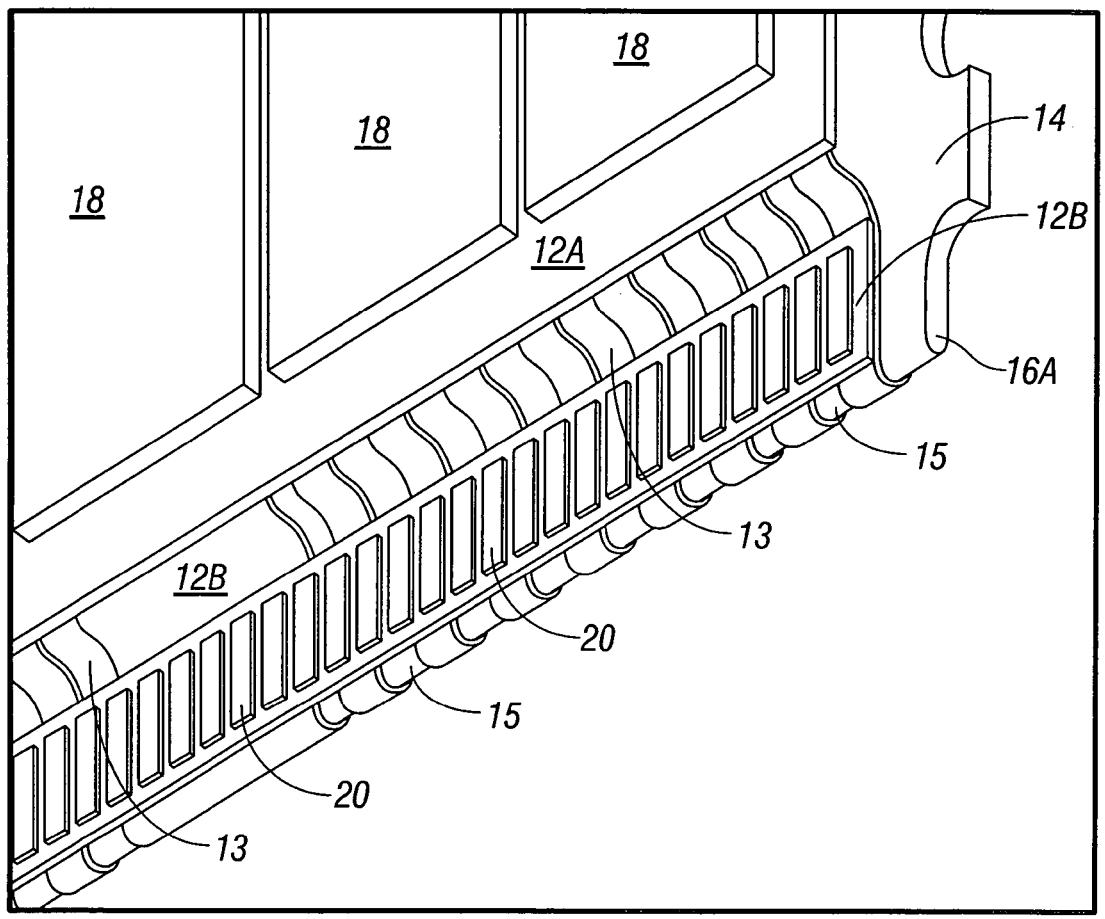
FIG. 2 is an enlarged view of the area marked "C" in FIG. 1.

FIG. 2 is an enlarged view of the area marked "C" in FIG. 1. As shown in FIG. 2, flex circuit 12 has portions 12A and 12B. Strain penetrations 15 are disposed in flex circuit 12 along its portion that transits the end portion 16A of substrate 14. Portion 12B of flex circuit 12 that transits about end 16A of substrate 14 contains circuit pathways that provide various connections from side A to side B of circuit module 10. Thus, circuit module 10 exhibits connections from one side of the module to another side without the connections being required to pass through the substrate 14.

Figure 3:
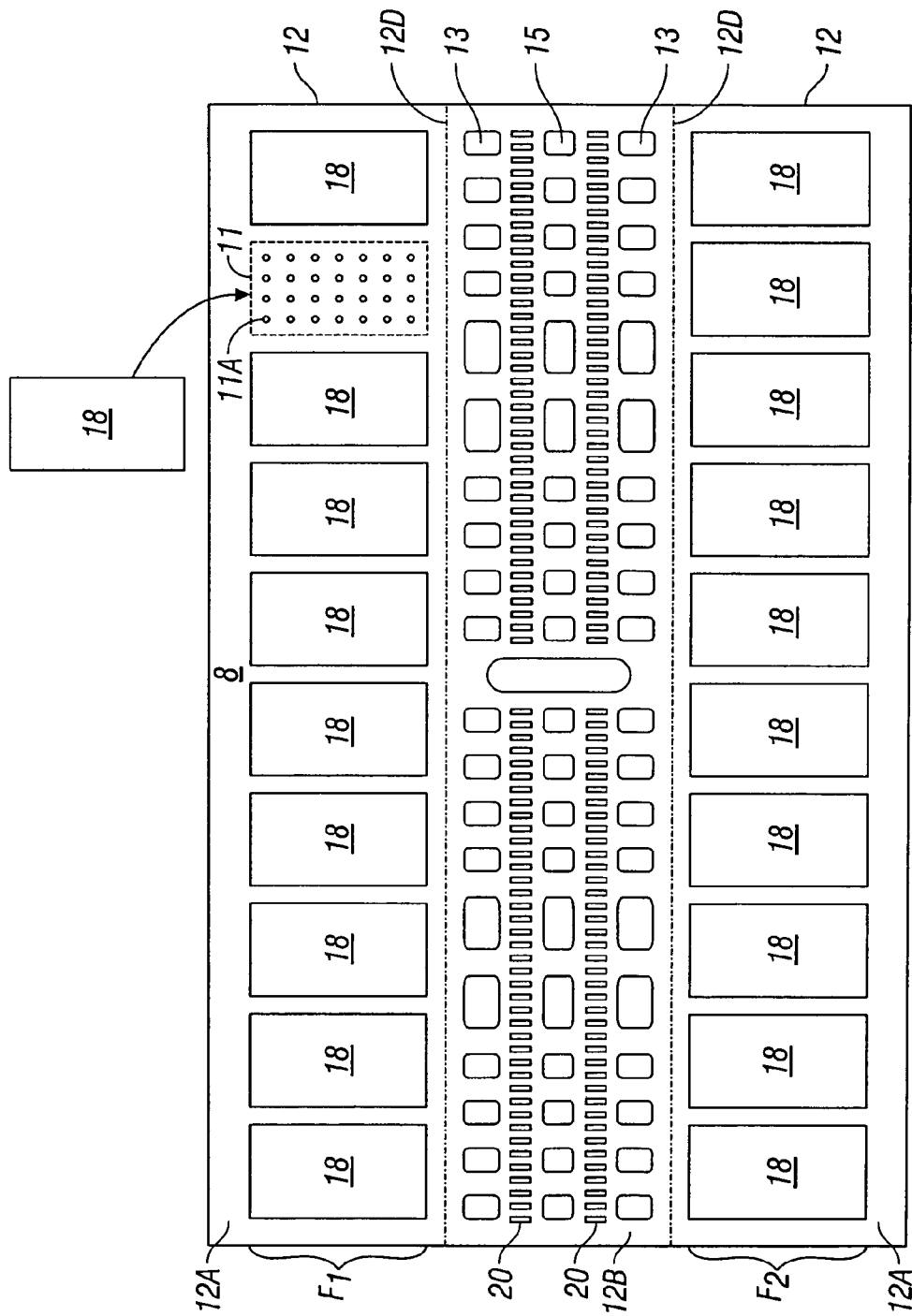
FIG. 3 is a depiction of one side of a flex circuit employed in a preferred embodiment of the present invention.

FIG. 3 is a depiction of side 8 of a flex circuit 12 in accordance with a preferred embodiment of the present invention. Flex circuit 12 may come in a variety of shapes including but not limited to square. Contact arrays such as array 11 are disposed beneath ICs 18 and IC 19 (shown in FIG. 4) and are comprised of array contacts 11A. An exemplar contact array 11 is shown as is exemplar IC 18 to be mounted at contact array 11 as depicted.

Those of skill will recognize that the identified pluralities F1 and F2 of ICs are, when disposed in the configurations depicted, typically described as "ranks". Between the ranks F1 and F2, flex circuit 12 bears a plurality of module contacts allocated in this embodiment into two rows of module contacts 20. When flex circuit 12 (FIG. 4) is folded about substrate 14 as earlier depicted, side 8 depicted in FIG. 3 is presented at the outside of module 10. The opposing side 9 of flex circuit 12 (FIG. 4) is on the inside in depicted configurations of module 10 and thus side 9 is closer to the substrate 14 about which flex circuit 12 is disposed than is side 8. Other embodiments may have other numbers of ranks and combinations of plural ICs connected to create the module of the present invention. In the depicted embodiment, portions 12A and 12B are shown as being delineated from each other by dotted line 12D. Line 12D is shown for illustrative purposes. Contacts 20 are shown located near a central axis of flex circuit 12 but may be located near an edge of flex circuit 12 in embodiments that locate the circuitry on only one side of substrate 14, for example. Such examples are shown in U.S. patent application Ser. No. 11/123,721 which has been incorporated by reference herein.

Typically, flex circuit 12 is a multi-layer flex circuit having multiple conductive planes or layers from which are configured appropriate traces to implement the required connections of the module. The number of layers and their arrangement varies from portion 12A to portion 12B, however, in a preferred embodiment. Strain penetrations 15 are shown in FIG. 3 as are strain penetrations 13 in part of portion 12B.

Figure 4:
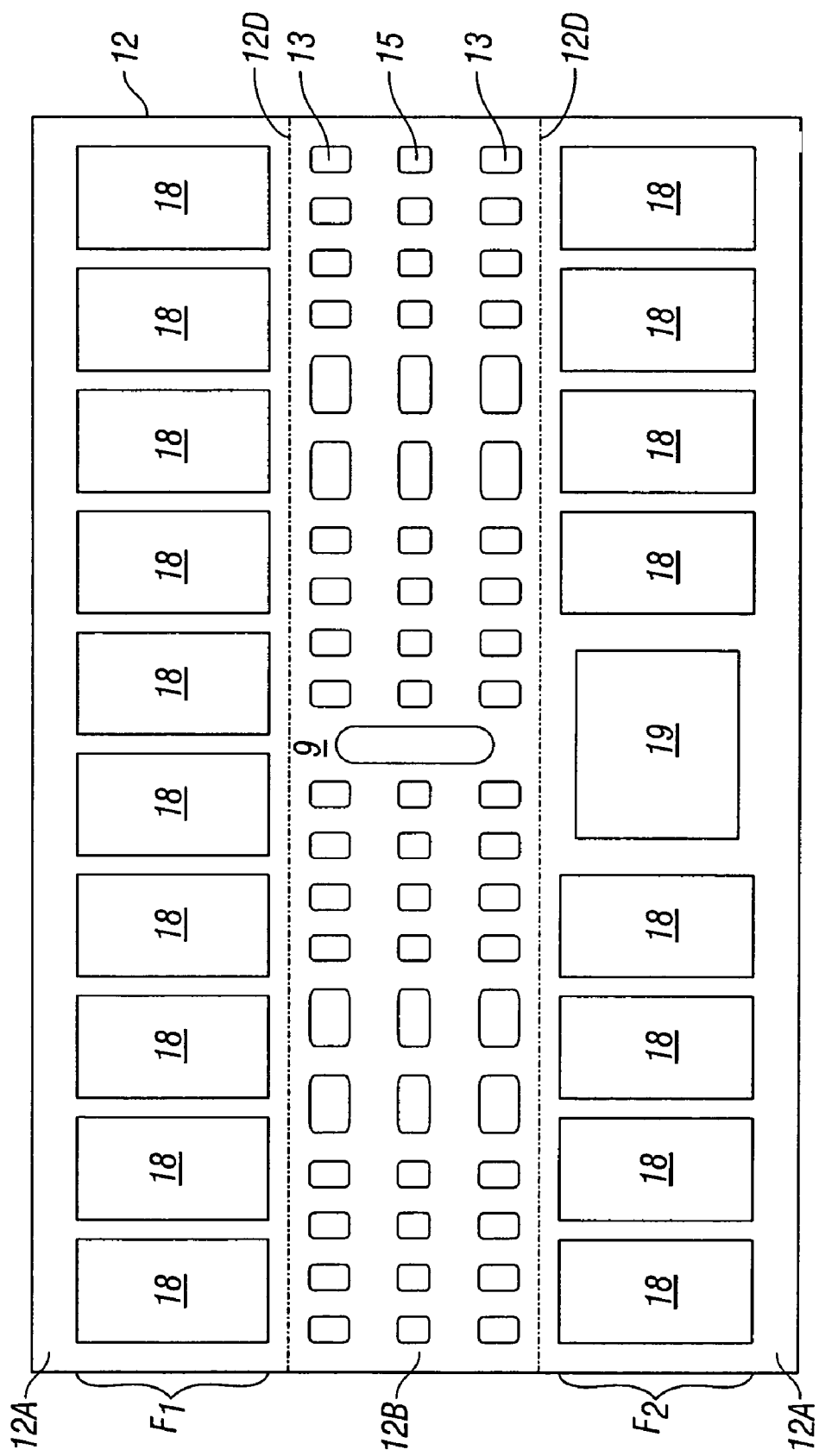
FIG. 4 depicts another side of a flex circuit employed in a preferred embodiment of the present invention.

FIG. 4 illustrates major side 9 of flex circuit 12 which is the side opposite that depicted in FIG. 3. Depicted as IC 19, an advanced memory buffer or AMB is disposed on side 9 of flex circuit 12 along with multiple iterations of ICs 18. No contacts 20 are exhibited by this exemplar depiction of side 9 given that this side of flex circuit 12 will be disposed on the "inner" side of module 10 when flex circuit 12 is disposed about substrate 14.

Figure 5:
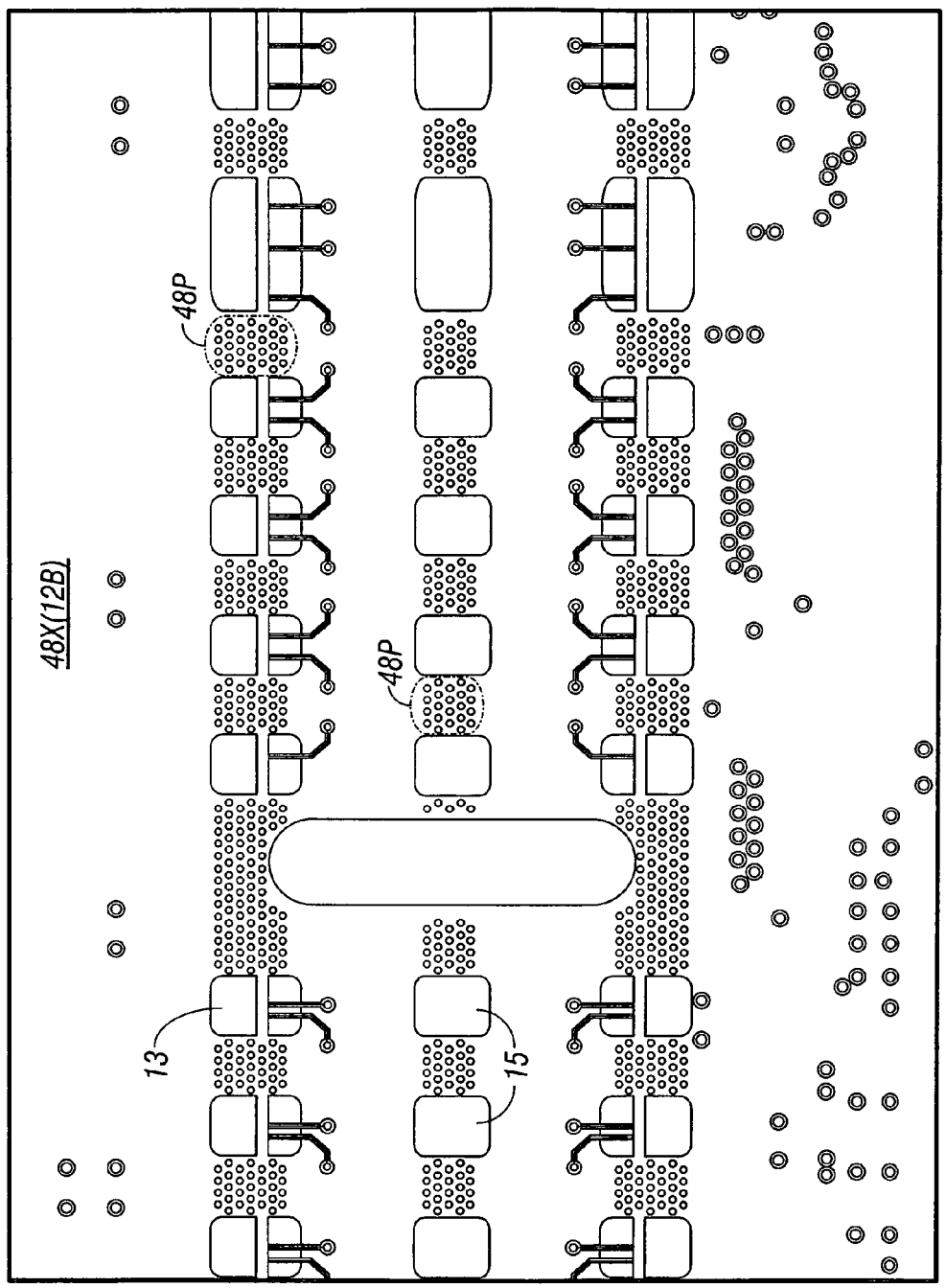
FIG. 5 is a depiction of a portion of a conductive layer of a portion of a of flex circuit devised in accordance with the present invention.

FIG. 5 is a depiction of a portion of a metal layer 48X of portion 12B of flex circuit 12 devised in accordance with the present invention. As shown, metal layer 48X exhibits strain penetrations 15 and 13 that pass through flex circuit 12. For further strain relief, portions of metal layer 48X of flex circuit 12 are patterned as exemplified by references 48P.

Figure 6:
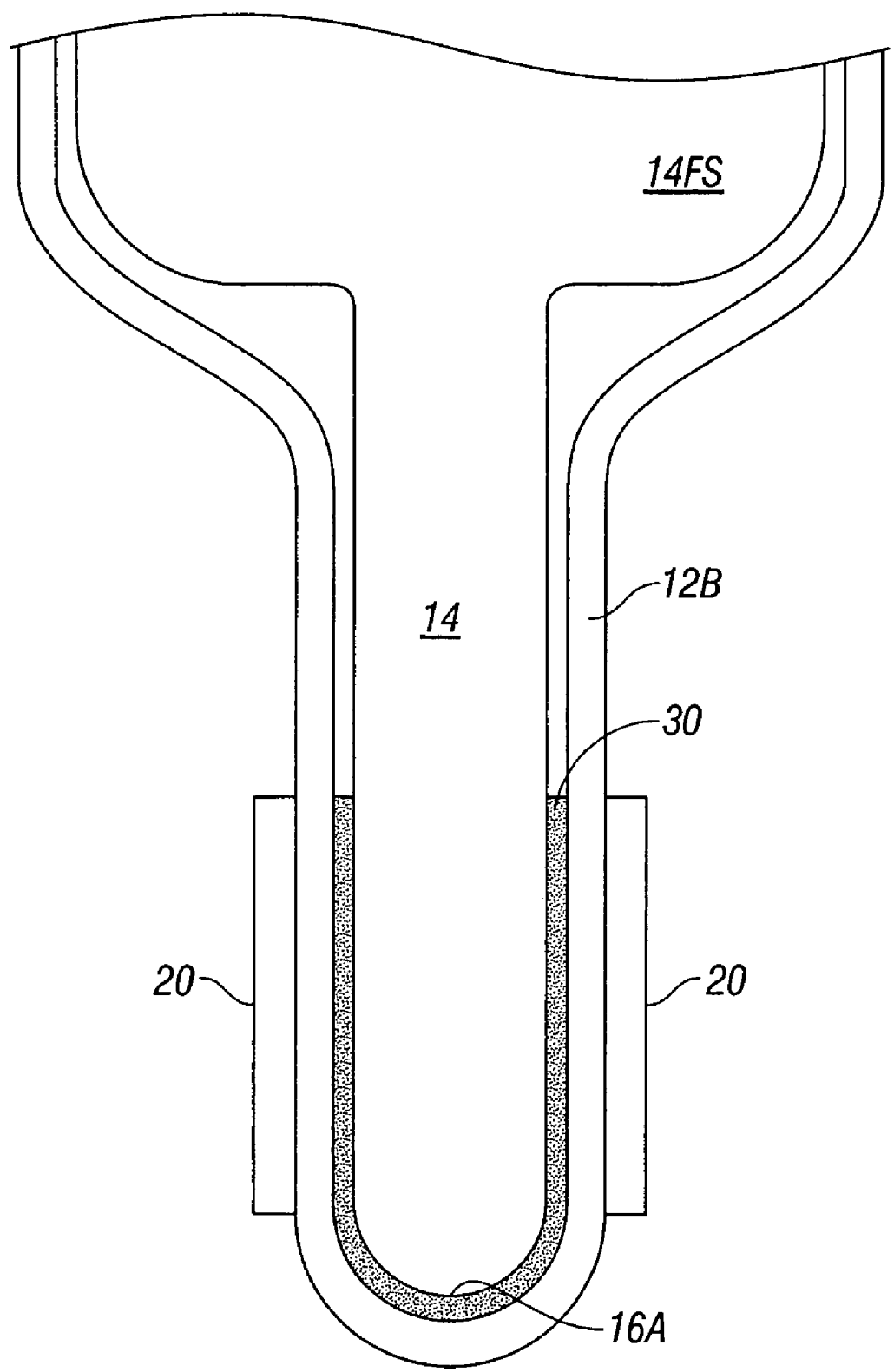
FIG. 6 depicts a cross-section of a portion of a module showing a portion of a flex circuit transiting about an end of a substrate in accordance with a preferred embodiment.

FIG. 6 depicts a cross-section of a portion of module 10 showing portion 12B of flex circuit 12 transiting about end 16A of substrate 14. Adhesive 30 is shown that may, in some embodiments, be employed to affix together substrate 14 and flex circuit 12 in the area depicted as well as other portions of the module as those of skill be recognize.

Figure 7:
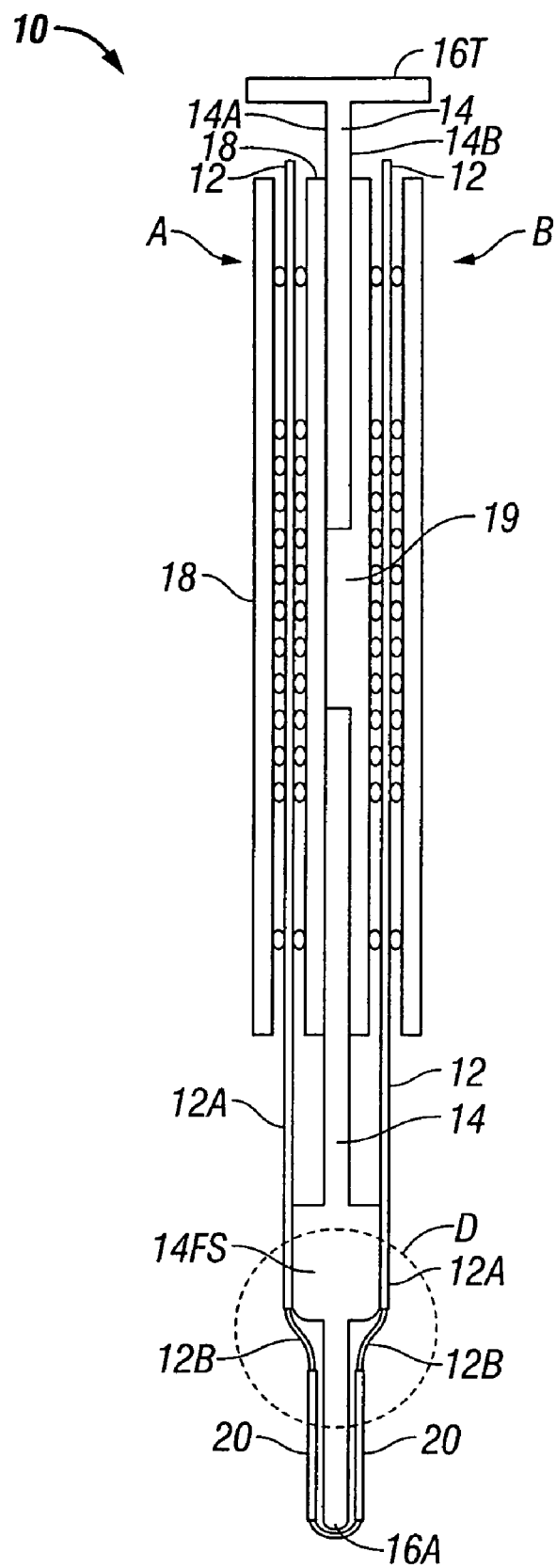
FIG. 7 is a cross-sectional depiction of an exemplar module 10 according to a preferred embodiment.

FIG. 7 is a cross-sectional depiction of an exemplar module 10 according to a preferred embodiment. As shown, module 10 includes ICs 18 and at least one IC 19 depicted with the profile of an AMB. As shown, there is a cutout area of substrate 14 into which at least a portion of IC 19 may be disposed. Further embodiments that employ cutaway and window implementations of substrate 14 are disclosed in a variety of the patent applications incorporated by reference herein. Those of skill will recognize that module 10 may be populated with integrated circuits of a variety of functions and types including but not limited to memory, logic, graphics, microprocessors, FPGA, and communications, for example. Flex support 14FS is shown as are portions 12A and 12B of flex circuit 12.

Figure 8:
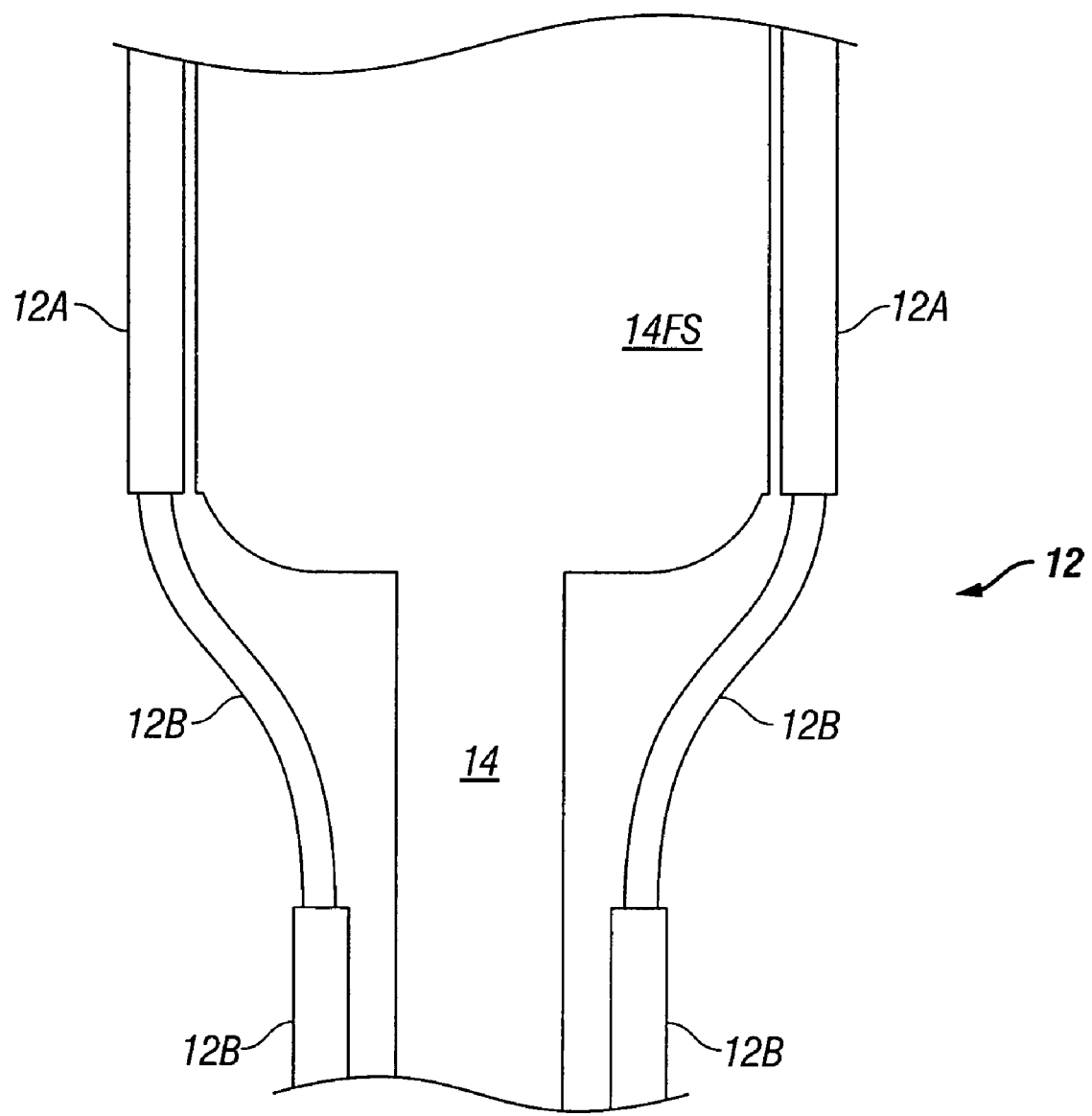
FIG. 8 is an enlarged depiction of the area marked "D" in FIG. 7.

FIG. 8 is an enlarged depiction of the area marked "D" in FIG. 7. As depicted in FIG. 8, flex circuitry 12 exhibits two portions 12A and portion 12B. FIG. 8 depicts an enlarged view of the area near end or edge 16A of an exemplar module 10. While a rounded configuration is shown, edge 16A may take on other shapes devised to mate with various connectors or sockets. The form and function of various edge card connectors are well know in the art. In many preferred embodiments, flex 12 is wrapped around edge 16A of substrate 14 and may be laminated or adhesively connected to substrate 14 with adhesive 30. Flex circuit 12 may vary in thickness and is not strictly shown to scale. The depicted substrate 14 has a thickness such that when assembled with the flex 12 and adhesive 30, the thickness measured between module contacts 20 falls in the range specified for the mating connector. Although a preferred implementation of flex circuit 12 is a rigid-flex circuit, in some other embodiments, flex circuit 12 may be implemented with two rigid boards as implementations of preferably rigid portions 12A of flex circuits 12 while portion 12B may be a flexible circuit. Such a construction is shown in U.S. application Ser. No. 11/131,835, filed May 18, 2005 which application has been incorporated by reference herein. In other embodiments, contacts 20 need not be on both sides of module 10 and may be exhibited on only one side in configurations.

Figure 9:
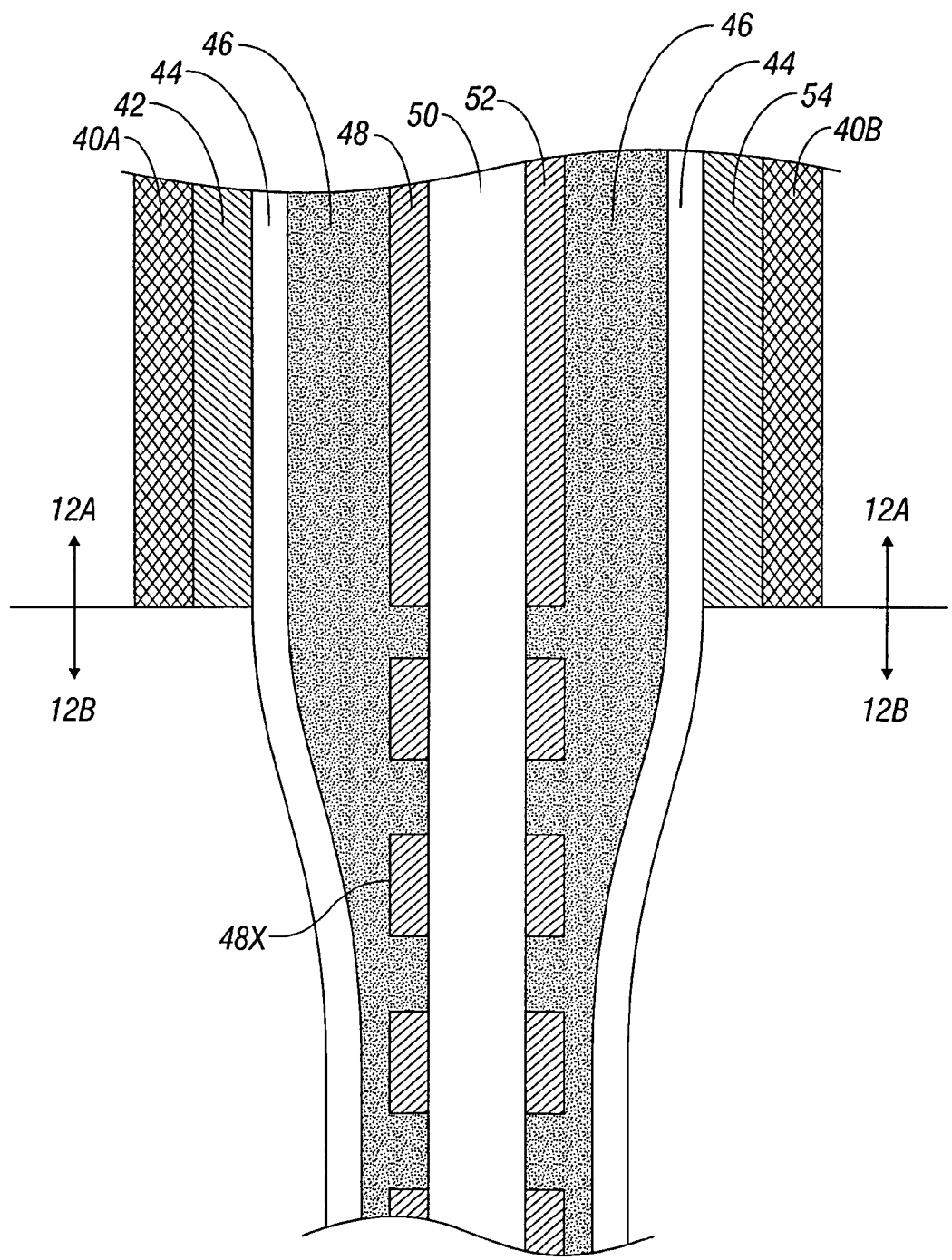
FIG. 9 is an exemplar construction detail illustrating internal layer constructions for a flex circuitry in accordance with a preferred embodiment.

FIG. 9 is an exemplar construction detail illustrating internal layer constructions for flex circuit 12 in portions 12A and 12B. In portions 12A, outer layers 40a and 40b are preferably solder masks, a construction well known in the industry. Those of skill will recognize that solder mask layers are not required to implement flex circuitry that may function as flex circuit 12 in the context of the invention. Layer 42 is a first conductive layer preferably comprised of copper while layer 44 is polyimide in a preferred embodiment. As shown, those layers that continue in portion 12B of flex circuit 12 are seen on both sides of central polyimide layer 50. Layer 46 is an adhesive while layer 48 is a second conductive layer which, like layer 42, is preferably comprised of copper. Layer 52 is a third conductive layer preferably comprised of copper and layer 54 is a fourth conductive layer preferably comprised of copper. As depicted in the flex circuit 12B portion of flex circuit 12, layer 48 is identified as 48X to indicate the preferred cross-hatched nature of that layer in that portion 12B of flex circuit 12.

Although the present invention has been described in detail, it will be apparent to those skilled in the art that many embodiments taking a variety of specific forms and reflecting changes, substitutions and alterations can be made without departing from the spirit and scope of the invention. Therefore, the described embodiments illustrate but do not restrict the scope of the claims.

The invention claimed is:

1. A circuit module comprising:
   a rigid substrate comprised of thermally conductive material and having first and second opposing lateral sides and a bottom edge; and
   a flex circuit having multiple conductive layers and a mounting portion and a substrate transit portion, the substrate transit portion having a row of voids, the mounting portion having more conductive layers than does the substrate transit portion, the flex circuit having a first side and a second side with the first side having plural edge connector contacts for connection of the circuit module to an edge connector, the first side having mounted on the mounting portion of the flex circuit, a first set of CSPs (chip scale packaged devices), and the second side having mounted on the mounting portion of the flex circuit, a second set of CSPs (chip scale packaged devices), the substrate transit portion being disposed about the bottom edge of the rigid substrate to expose on the outside of the circuit module the plural edge connector contacts and the first set of CSPs while disposing the second set of CSPs between the flex circuit and at least one of the first or second opposing lateral sides of the rigid substrate.

2. The circuit module of claim 1 in which the row of voids comprises voids that pass entirely through the substrate transit portion of the flex circuit.

3. The circuit module of claim 1 in which the row of voids comprises voids that pass through only one conductive layer of the substrate transit portion of the flex circuit.

4. A circuit module comprising:
   a rigid substrate having first and second opposing lateral sides and a bottom edge; and
   a flex circuit having multiple conductive layers and a mounting portion and a substrate transit portion, the mounting portion having more conductive layers than does the substrate transit portion, the multi-layered flex circuit having a first side and a second side with the first side having plural edge connector contacts for connection of the circuit module to an edge connector, the first side having mounted on the mounting portion of the flex circuit, a first set of CSPs (chip scale packaged devices), and the second side having mounted on the mounting portion of the flex circuit, a second set of CSPs (chip scale packaged devices), the substrate transit portion being disposed about the bottom edge of the rigid substrate to expose on the outside of the circuit module the plural edge connector contacts and the first set of CSPs while disposing the second set of CSPs between the flex circuit and at least one of the first or second opposing lateral sides of the rigid substrate.

* * * * *